United States Patent
Nezuka

(10) Patent No.: US 9,110,114 B2
(45) Date of Patent: Aug. 18, 2015

(54) DETECTION CIRCUIT FOR CAPACITIVE SENSOR

(71) Applicant: DENSO CORPORATION, Kariya, Aichi-pref. (JP)

(72) Inventor: Tomohiro Nezuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 144 days.

(21) Appl. No.: 13/936,256

(22) Filed: Jul. 8, 2013

(65) Prior Publication Data

US 2014/0015544 A1  Jan. 16, 2014

(30) Foreign Application Priority Data

Jul. 13, 2012  (JP) ................................. 2012-157525

(51) Int. Cl.
　　*G01R 27/26*　(2006.01)
　　*G01D 5/241*　(2006.01)

(52) U.S. Cl.
　　CPC .......... *G01R 27/2605* (2013.01); *G01D 5/2417* (2013.01)

(58) Field of Classification Search
　　USPC .......................... 324/679, 658, 647, 665, 674
　　See application file for complete search history.

(56) References Cited

U.S. PATENT DOCUMENTS

| | | | |
|---|---|---|---|
| 2002/0175692 A1* | 11/2002 | Lasalandra et al. | 324/684 |
| 2003/0052699 A1* | 3/2003 | Lasalandra et al. | 324/662 |
| 2007/0163815 A1* | 7/2007 | Ungaretti et al. | 178/18.06 |
| 2010/0007428 A1* | 1/2010 | Nezuka | 331/36 C |
| 2012/0326905 A1* | 12/2012 | Nezuka | 341/136 |
| 2014/0015544 A1* | 1/2014 | Nezuka | 324/603 |

FOREIGN PATENT DOCUMENTS

JP　　2008-102091　　* 5/2008　............... G01L 9/00

OTHER PUBLICATIONS

Lemkin, Mark and Bernhard E. Boser. "A Three-Axis Micromachined Accelerometer with a CMOS Position-Sense Interface and Digital Offset-Trim Electronics," IEEE Journal of Solid-State Circuits, 34(4), 456-468, Apr. 1999. (Discussed on pp. 1-2 of the specification.).
U.S. Appl. No. 13/936,250, filed Jul. 8, 2013, Nezuka.

* cited by examiner

*Primary Examiner* — Tung X Nguyen
*Assistant Examiner* — Alesa Allgood
(74) *Attorney, Agent, or Firm* — Posz Law Group, PLC

(57) ABSTRACT

A detection circuit for a capacitive sensor includes a drive signal generator for applying drive signal to a sensor common terminal, a sense amplifier having input terminals respectively connected to sensor detection terminals, and a controller for controlling input common-mode voltage of the sense amplifier to predetermined voltage. The controller includes a feedback amplifier for outputting feedback voltage according to difference between the common-mode and predetermined voltages, a pair of first feedback capacitors having one ends respectively connected to the detection terminals and another ends connected together, a second feedback capacitor having one end connected to the other ends, and a voltage switcher for applying first preset voltage to the other ends during first level of the drive signal and for applying second preset voltage to the other ends and the predetermined voltage to another end of the second feedback capacitor during second level of the drive signal.

12 Claims, 7 Drawing Sheets

Reset

CV1, CV2

Coarse

Reset

CV1, CV2

Coarse

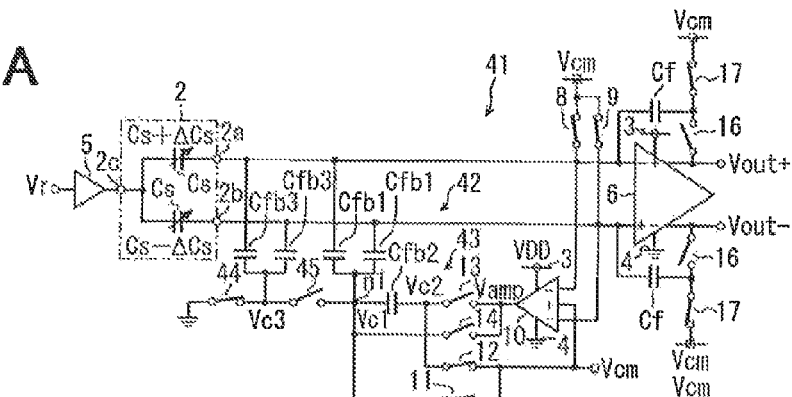
FIG. 7A Reset
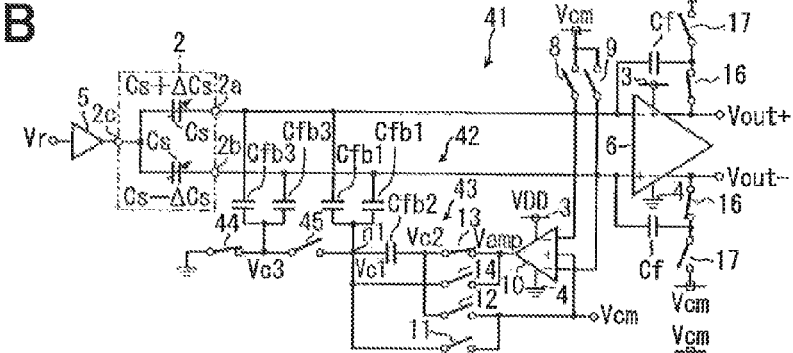
FIG. 7B CV1
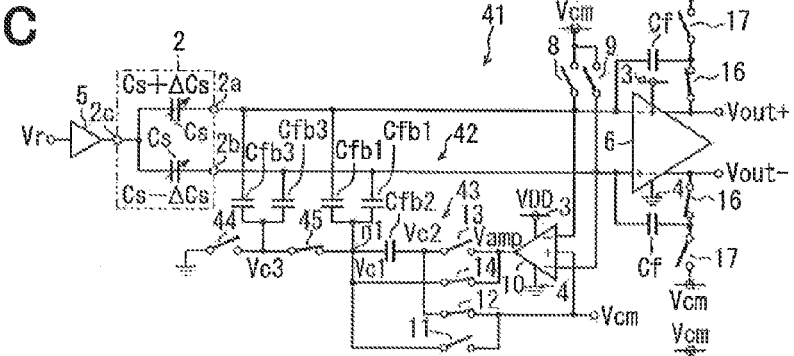
FIG. 7C Coarse
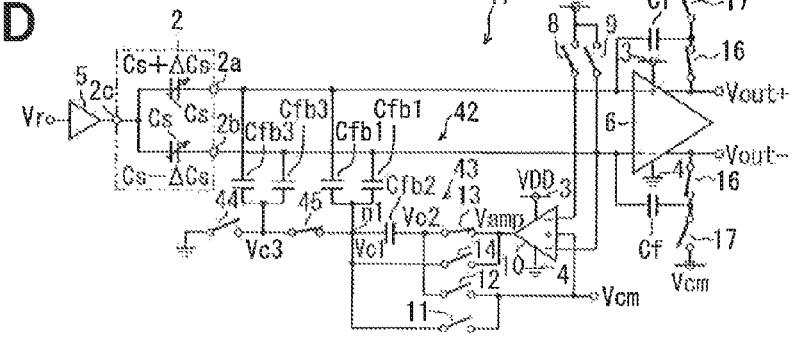
FIG. 7D CV2

DETECTION CIRCUIT FOR CAPACITIVE SENSOR

CROSS REFERENCE TO RELATED APPLICATION

This application is based on Japanese Patent Application No. 2012-157525 filed on Jul. 13, 2012, the contents of which are incorporated herein by reference.

FIELD

The present disclosure relates to a detection circuit having a common-mode feedback circuit and used for a capacitive sensor.

BACKGROUND

A capacitive sensor has a pair of sense capacitors with capacitances, the difference between which changes according to a physical quantity such as acceleration or pressure. One ends of the sense capacitors are connected together to provide a common terminal. Another ends of the sense capacitors are configured to provide separate detection terminals. The detection circuit applies a drive signal varying between two levels to the common terminal, converts the difference between the capacitances of the sense capacitors to a voltage, and outputs an electrical signal having a voltage value according to the physical quantity.

A detection circuit with a fully differential switched capacitor amplifier (sense amplifier) has been proposed as an example of this type of detection circuit (refer to a non-patent document 1). This detection circuit has a great effect on suppression of common-mode noise, is capable of reducing errors such as charge injection and clock feedthrough, and is capable of increasing amplitude of an output signal by using differential output.

Even when a fully differential amplifier is simply used in a detection circuit, a voltage at an input terminal varies largely according to a drive signal. A sense amplifier needs to have a wide input range for a variation in an input common-mode voltage. Further, influence of a mismatch of a parasitic capacitance at an input terminal of a C-V conversion circuit appears, and influence of an offset of a sense amplifier depending on an input common-mode voltage appears. Therefore, in the detection circuit disclosed in the non-patent document 1, a common-mode feedback loop is added to stabilize an input common-mode voltage to a desired constant voltage.

In another configuration to stabilize an input common-mode voltage, one end of a compensation capacitor is connected to a detection terminal, and an inversion signal opposite in phase to a drive signal is applied to the other end (refer to a patent document 1). In practice, even in this configuration, a common-mode feedback loop is necessary to prepare for a difference in capacitance between a sense capacitor and a compensation capacitor due to, for example, manufacturing variation, aging degradation, and temperature drift.

PRIOR ART DOCUMENT

Patent Document

[Patent Document 1] US 2007/0163815A

Non-Patent Document

[Non-Patent Document 1] "A Three-Axis Micromachined Accelerometer with a CMOS Position-Sense Interface and Digital Offset-Trim Electronics" by M. Lemkin, B. E. Boser, IEEE Journal of Solid-State Circuits, Vol. 34, No. 4, April 1999, pp. 456-468

SUMMARY

In the detection circuit disclosed in the non-patent document 1, a feedback capacitor having a sufficiently large capacitance relative to a sense capacitor is necessary. Even in the detection circuit disclosed in the patent-document 1, because of the wide capacitance range of the sense capacitor, the capacitance of the feedback capacitor needs to be large to allow wide variations in capacitances of the sense capacitor and the compensation capacitor. If the capacitance of the feedback capacitor is small, an output of the feedback capacitor varies according to the difference in capacitance between the sense capacitor and the compensation capacitor, and the input common-mode voltage deviates due to the fact that the gain of the feedback amplifier is finite.

However, as described in the patent document 1, when the capacitances of the capacitors (sense capacitor, compensation capacitor) connected to the input terminal of the sense amplifier are increased, noise charge amount is increased. As a result, the accuracy of the C-V conversion performed by the detection circuit may be degraded. That is, in the conventional structures, since the amount of deviation of the input common-mode voltage from a desired value has a conflicting relationship with the amount of noise, the detection accuracy is degraded in either case.

In view of the above, it is an object of the present disclosure to provide a detection circuit used for a capacitive sensor and configured to achieve high detection accuracy with a common-mode feedback circuit.

According to a first aspect of the present disclosure, a detection circuit is used for a capacitive sensor including a pair of sense capacitors with capacitances having a difference responsive to a physical quantity. One ends of the sense capacitors are connected together to provide a common terminal, and another ends of the sense capacitors are configured to provide separate detection terminals. The detection circuit includes a drive signal generation circuit capable of generating and applying a drive signal varying between a first level and a second level to the common terminal, a fully differential sense amplifier having inverting and non-inverting input terminals respectively connected to the detection terminals and capable of outputting a differential voltage according to the difference between the capacitances of the sense capacitors, and a common-mode voltage control circuit capable of controlling an input common-mode voltage of the sense amplifier to a predetermined voltage.

The common-mode voltage control circuit includes a feedback amplifier, a pair of first feedback capacitors, a second feedback capacitor, and a voltage switch circuit. The feedback amplifier outputs a feedback voltage according to a difference between the input common-mode voltage and the predetermined voltage. The first feedback capacitors have one ends respectively connected to the detection terminals and have another ends connected together. The second feedback capacitor has one end connected to the other ends of the first feedback capacitors. The voltage switch circuit applies the predetermined voltage or a first preset voltage to the other ends of the first feedback capacitors to charge the first feedback capacitors during the first level of the drive signal. The first preset voltage has a voltage value existing in a voltage direction in which the second level exists relative to the first level with respect to the predetermined voltage. The voltage switch circuit applies a second preset voltage to the other ends of the first feedback capacitors and applies the predetermined voltage to another end of the second feedback capacitor to charge the second feedback capacitor during the second level of the drive signal, and then applies the feedback voltage to the other end of the second feedback capacitor instead of the application of the second preset voltage and the predetermined voltage. The second preset voltage has a voltage value existing in a voltage direction in which the first level exists relative to the second level with respect to the predetermined voltage.

According to a second aspect of the present disclosure, a detection circuit is used for a capacitive sensor including a pair of sense capacitors with capacitances having a difference responsive to a physical quantity. One ends of the sense capacitors are connected together to provide a common terminal, and another ends of the sense capacitors are configured to provide separate detection terminals. The detection circuit includes a drive signal generation circuit capable of generating and applying a drive signal varying between a first level and a second level to the common terminal, a fully differential sense amplifier having inverting and non-inverting input terminals respectively connected to the detection terminals and capable of outputting a differential voltage according to the difference between the capacitances of the sense capacitors, and a common-mode voltage control circuit capable of controlling an input common-mode voltage of the sense amplifier to a predetermined voltage.

The common-mode voltage control circuit includes a pair of compensation capacitors, an inversion drive signal generation circuit, a feedback amplifier, a pair of first feedback capacitors, a second feedback capacitor, and a voltage switch circuit. The compensation capacitors have one ends respectively connected to the detection terminals and have another ends connected together. The inversion drive signal generation circuit generates and applies an inversion drive signal to the other ends of the compensation capacitors. The inversion drive signal varies between the second level and the first level in such a manner that the inversion drive signal has an opposite phase to the drive signal. The feedback amplifier outputs a feedback voltage according to a difference between the input common-mode voltage and the predetermined voltage. The first feedback capacitors have one ends respectively connected to the detection terminals and have another ends connected together. The second feedback capacitor has one end connected to the other ends of the first feedback capacitors. The voltage switch circuit applies a first preset voltage with a certain voltage value to the other ends of the first feedback capacitors to charge the first feedback capacitors during the first level of the drive signal. The voltage switch circuit applies the feedback voltage to the other ends of the first feedback capacitors and applies the predetermined voltage to another end of the second feedback capacitor to charge the second feedback capacitor during the second level of the drive signal, and then applies the feedback voltage to the other end of the second feedback capacitor instead of the application of the feedback voltage and the predetermined voltage.

According to a third aspect of the present disclosure, a detection circuit is used for a capacitive sensor including a pair of sense capacitors with capacitances having a difference responsive to a physical quantity. One ends of the sense capacitors are connected together to provide a common terminal, and another ends of the sense capacitors are configured to provide separate detection terminals. The detection circuit includes a drive signal generation circuit capable of generating and applying a drive signal varying between a first level and a second level to the common terminal, a fully differential sense amplifier having inverting and non-inverting input terminals respectively connected to the detection terminals and capable of outputting a differential voltage according to the difference between the capacitances of the sense capacitors, and a common-mode voltage control circuit capable of controlling an input common-mode voltage of the sense amplifier to a predetermined voltage.

The common-mode voltage control circuit includes a feedback amplifier, a pair of first feedback capacitors, a second feedback capacitor, a pair of third feedback capacitors, and a voltage switch circuit. The feedback amplifier outputs a feedback voltage according to a difference between the input common-mode voltage and the predetermined voltage. The first feedback capacitors have one ends respectively connected to the detection terminals and have another ends connected together. The second feedback capacitor has one end connected to the other ends of the first feedback capacitors. The third feedback capacitors have one ends respectively connected to the detection terminals and have another ends connected together. The voltage switch circuit applies a first preset voltage with a certain voltage value to the other ends of the first feedback capacitors to charge the first feedback capacitors and applies a second preset voltage to the other ends of the third feedback capacitors to charge the third feedback capacitors during the first level of the drive signal. The second preset voltage has a voltage value existing in a voltage direction in which the second level exists relative to the first level with respect to the predetermined voltage. The voltage switch circuit applies the feedback voltage to the other ends of the first feedback capacitors and the other ends of the third feedback capacitors and applies the predetermined voltage to another end of the second feedback capacitor to charge the second feedback capacitor during the second level of the drive signal, and then applies the feedback voltage to the other end of the second feedback capacitor instead of the application of the feedback voltage and the predetermined voltage.

BRIEF DESCRIPTION OF THE DRAWINGS

The above and other objects, features, and advantages will become more apparent from the following description and drawings. In the drawings:

FIG. 7A is a diagram illustrating a detection circuit during a period Reset according to a fourth embodiment of the present disclosure, FIG. 7B is a diagram illustrating the detection circuit during a period CV1 according to the fourth embodiment of the present disclosure, FIG. 7C is a diagram illustrating the detection circuit during a period Coarse according to the fourth embodiment of the present disclosure, and FIG. 7D is a diagram illustrating the detection circuit during a period CV2 according to the fourth embodiment of the present disclosure.

DETAILED DESCRIPTION

Figure 1A:
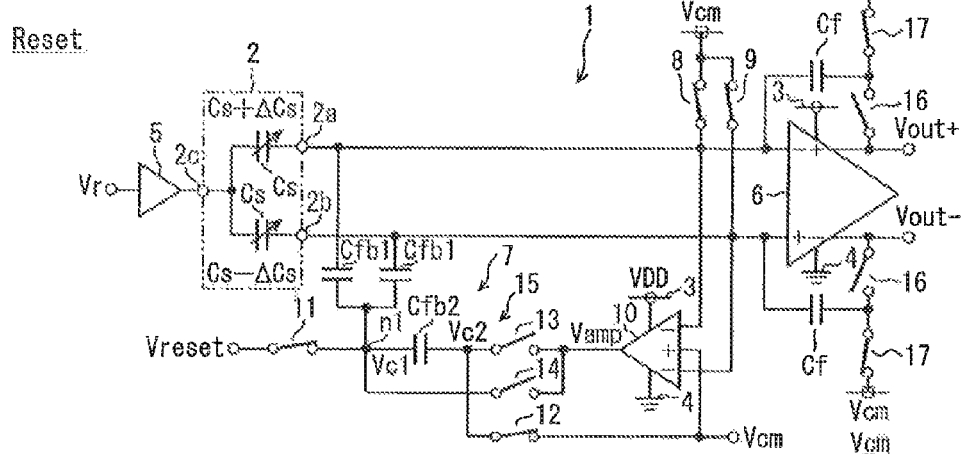
FIG. 1A is a diagram illustrating a detection circuit during a period Reset according to a first embodiment of the present disclosure.

In each embodiment, the same symbols will be used to represent substantially the same portions to omit explanation. Since each embodiment relates to control of an input common-mode voltage, a structure unrelated to the control is omitted.

First Embodiment

A first embodiment is described below with reference to FIG. 1A, FIG. 1B, FIG. 1C, and FIG. 2. A fully differential detection circuit 1 shown in FIGS. 1A-C performs a C-V conversion for a capacitive sensor 2 and outputs a detection signal indicative of a physical quantity such as acceleration or pressure. A CDS (correlated double sampling) circuit, which is not shown in the drawings, is connected to a latter part of the detection circuit 1 in order to eliminate an influence of an offset voltage of an operational amplifier from the detection signal. The detection circuit 1 operates on a power supply voltage VDD supplied through power supply lines 3 and 4.

The capacitive sensor 2 includes a pair of sense capacitors Cs with capacitances changing in opposite phase according to the physical quantity in such a manner that when one sense capacitor Cs has the capacitance of Cs+ΔCs, the other sense capacitor Cs has the capacitance of Cs−ΔCs. One ends of the sense capacitors Cs are connected together to provide a common terminal 2c. The other ends of the sense capacitors Cs provide separate detection terminals 2a and 2c. The detection circuit 1 includes a drive signal generation circuit 5 and applies a drive signal Vr varying between a first level (e.g., twice a predetermined voltage Vcm) and a second level (e.g., 0V) to the common terminal 2c.

The detection circuit 1 includes a fully differential sense amplifier 6 with an inverting input terminal connected to the detection terminal 2a and a non-inverting input terminal connected to the detection terminal 2b. The sense amplifier 6 outputs a differential voltage according to a difference ±ΔCs between the capacitances of the sense capacitors Cs. A capacitor Cf with a capacitance of Cf is connected between the input and output terminals of the sense amplifier 6. The detection circuit 1 includes a common voltage control circuit 7 for controlling an input common-mode voltage of the sense amplifier 6 so that the input common-mode voltage can be equal to a predetermined voltage Vcm.

The predetermined voltage Vcm is set close to a median value between the power supply voltage VDD and a ground voltage 0V. A reason for this is that the median value is suitable for preventing a level of the input terminal from exceeding the power supply voltage when the level transiently varies due to drive of the sense capacitor Cs and also suitable for an operational amplifier to generate the median value when the predetermined voltage Vcm is generated by using the operational amplifier. Switches 8 and 9 for application of the predetermined voltage Vcm are connected to the respective input terminals of the sense amplifier 6. A switch 16 for connection to an output terminal of the sense amplifier 6 and a switch 17 for application of the predetermined voltage Vcm are connected to an output-side terminal of each capacitor Cf. A common-mode voltage control circuit for controlling an output common-mode voltage so that the output common-mode voltage can be equal to the predetermined voltage Vcm is incorporated in the sense amplifier 6.

The common-mode voltage control circuit 7 includes a feedback amplifier 10, a pair of first feedback capacitors Cfb1, a second feedback capacitor Cfb2, and a voltage switch circuit 15 constructed with switches 11-14. The feedback amplifier 10 is configured as a switched-capacitor circuit and outputs a feedback voltage Vamp (=gain×(predetermined voltage Vcm−input common-mode voltage)+constant voltage Vc) by amplifying a difference between the predetermined voltage Vcm and the input common-mode voltage which is an average voltage of two inverting input terminals. In the description below, the constant voltage Vc is assumed to be equal to the predetermined voltage Vcm, but not limited to it.

One ends of the feedback capacitors Cfb1 are connected to the respective detection terminals 2a and 2b. The other ends of the feedback capacitors Cfb1 are connected together to a node n1. A first preset voltage Vreset is applied to the node n1 through the switch 11, or the feedback voltage Vamp is applied to the node n1 through the switch 14. One end of the feedback capacitor Cfb2 is connected to the node n1. The preset voltage Vcm is applied to the other end of the feedback capacitor Cfb2 through the switch 12, or the feedback voltage Vamp is applied to the other end of the feedback capacitor Cfb2 through the switch 13. The switches 8, 9, 11, and 17 are ON during a period Reset. The switch 12 is ON during the period Reset and a period Coarse. The switch 13 is ON during a period CV1 and a period CV2. The switch 14 is ON during the period Coarse. The switch 16 is ON during periods except the period Reset.

Figure 2:
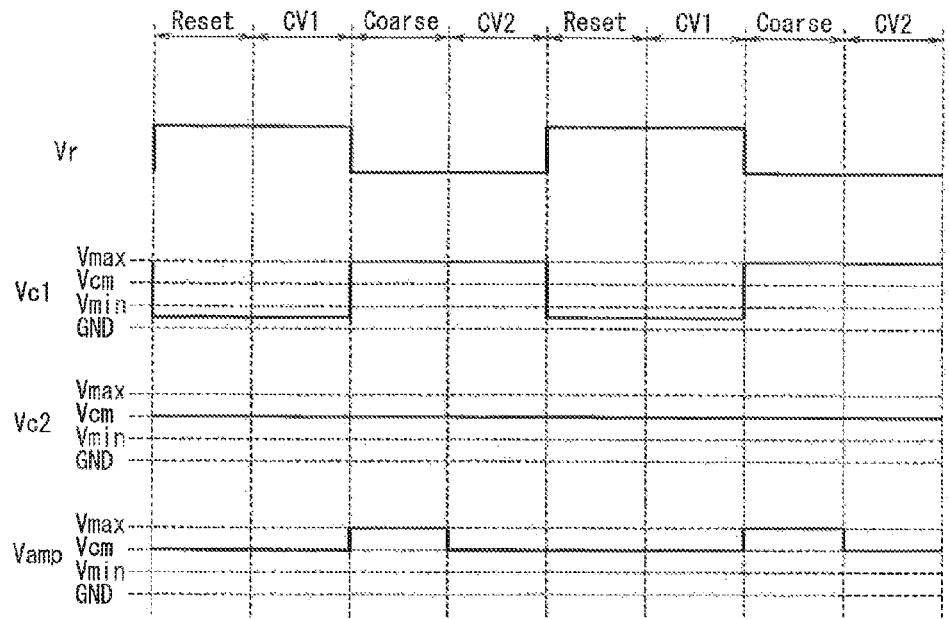
FIG. 2 is a waveform diagram illustrating control of an input common-mode voltage according to the first embodiment of the present disclosure.
Figure 4:
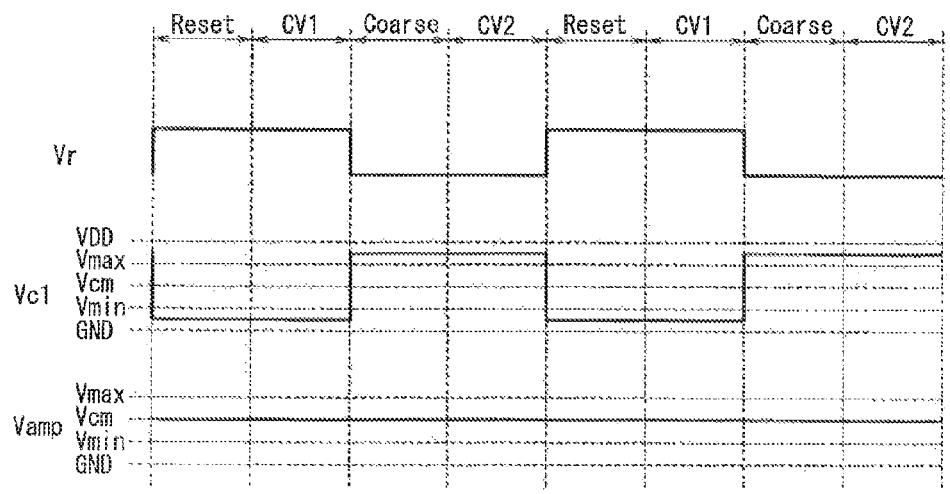
FIG. 4 is a waveform diagram illustrating control of an input common-mode voltage according to the second embodiment of the present disclosure.

Next, an effect associated with the control of the input common-mode voltage of the sense amplifier 6 is described. As shown in FIG. 2, the input common-mode voltage is controlled by repeating (a) the period Reset, (b) the period CV1, (c) the period Coarse, and (b) the period CV2 in turn. The drive signal Vr becomes 2Vcm (first level) during the period Reset and the period CV1 and becomes 0V (second level) during the period Coarse and the period CV2. Vc1 represents a voltage at the one end (the node n1) of the feedback capacitor Cb2. Vc2 represents a voltage at the other end of the feedback capacitor Cb2. In calculations described below, unless otherwise noted, the gain of the feedback amplifier is assumed to be infinity.

During the period Reset, the switches 13, 14, and 16 are OFF, and the switches 8, 9, 11, 12, and 17 are ON. Thus, the preset voltage Vreset is applied to the node n1 so that charge can be stored in the feedback capacitors Cfb1 to counter the inversion of the level of the drive signal yr. The preset voltage Vreset is a voltage existing in a voltage direction in which the second level exists relative to the first level with respect to the predetermined voltage Vcm, i.e., is a voltage existing in a low voltage direction with respect to the predetermined voltage Vcm.

As described later, it is preferable that the preset voltage Vreset be set to a lower value to reduce the capacitance of the feedback capacitor Cfb1. For this reason, it is set to a voltage between a voltage of the low-voltage side power supply line 4 (ground line) and a lower limit voltage Vmin outputtable by the feedback amplifier 10 in a low voltage direction. Further, charge corresponding to a difference between the preset voltage Vreset and the predetermined voltage Vcm is stored in the feedback capacitor Cfb2 so that the feedback voltage Vamp during the period CV1 can be equal to the predetermined voltage Vcm.

During the period CV1, the switches 8, 9, 11, 12, 14, and 17 are OFF, and the switches 13 and 16 are ON, so that a common-mode feedback loop can be formed through the feedback capacitors Cfb1 and Cb2. Thus, the input common-mode voltage is controlled to be equal to the predetermined voltage Vcm. The charge stored in the feedback capacitor Cfb2 during the period Reset level-shifts the feedback voltage Vamp from the voltage Vc1 of the node n1 (preset voltage Vreset), so that the feedback voltage Vamp can be equal to the predetermined voltage Vcm.

Since the gain of the feedback amplifier 10 is finite, a voltage error of (output voltage Vamp−constant voltage Vc)/gain (=(output voltage Vamp−predetermined voltage Vcm)/gain) remains at the input terminal. However, this voltage error does not occur during the period CV1 where Vamp=Vcm. Therefore, the sense amplifier 6 outputs voltages Vcm+Voffset and Vcm−Voffset containing only errors due to offset voltages of the sense amplifier 6 and the feedback amplifier 10. The CDS circuit holds output voltages Vout+ and Vout− at this time.

During the period Coarse, the switches 8, 9, 11, 13, and 17 are OFF, and the switches 12, 14, and 16 are ON, so that a common-mode feedback loop can be formed through the feedback capacitors Cfb1. The feedback capacitor Vamp applied to the node n1 corresponds to a second preset voltage. When the drive signal Vr decreases from 2Vcm to 0V, the feedback voltage Vamp increases so that the input common-mode voltage can be equal to the predetermined voltage Vcm. At this time, the feedback voltage Vamp is a voltage existing in a voltage direction in which the first level exists relative to the second level with respect to the predetermined voltage Vcm, i.e., is a voltage existing in a high voltage direction with respect to the predetermined voltage Vcm.

At this time, since the feedback capacitor Cfb1 has the charge stored during the period Reset, the increase in the feedback voltage Vamp is reduced by the charge. In other words, the capacitance of the feedback capacitor Cfb1 necessary to keep the input common-mode voltage at the predetermined voltage Vcm can be reduced by the charge prestored in the feedback capacitor Cfb1.

When calculated with respect to the input terminal of the sense amplifier 6, a common-mode charge QCV1 during the period CV1 can be given by an equation (1).

$$QCV1 = Cfb1(Vcm - Vreset) - CsVcm \quad (1)$$

A common-mode charge Qcoarse during the period Coarse can be given by an equation (2).

$$Qcoarse = Cfb1(Vin - Vamp) + CsVin + Cf(Vin - Vcm) \quad (2)$$

Since QCV1=Qcoarse according to the law of conservation of charge, an equation (3) can be obtained. This equation represents a relationship between the feedback voltage Vamp and the input common-mode voltage Vin during the Coarse period.

$$Vin = \frac{Cfb1(Vamp - Vreset) + (Cfb1 - Cs + Cf)Vcm}{Cfb1 + Cs + Cf} \quad (3)$$

The equation (3) indicates that the feedback voltage Vamp needs to be higher as the capacitance of the sense capacitor Cs is larger or as the capacitance of the feedback capacitor Cfb1 is smaller. When the output voltage Vamp exceeds a limit voltage (upper limit voltage Vmax or lower limit voltage Vmin), the feedback amplifier 10 cannot have the gain enough to achieve a feedback control effect. Therefore, during the period Coarse where the control is roughly performed, the input common-mode voltage may decrease below the predetermined voltage Vcm due to a limit of the feedback voltage Vamp or due to a reduction in the gain. Further, due to a deviation between the feedback voltage Vamp and the predetermined voltage Vcm, the voltage error caused by the finite nature of the gain is left. Therefore, the common-mode voltage control circuit 7 switches to the CV2 period and performs the control more accurately. As a preparation to do this, charge corresponding to a difference between the feedback voltage Vamp and the predetermined voltage Vcm is stored in the feedback capacitor Cfb2.

During the period CV2, the switches 8, 9, 11, 12, 14, and 17 are OFF, and the switches 13 and 16 are ON, so that a common-mode feedback loop can be formed through the feedback capacitors Cfb1 and Cb2 like during the period CV1. The charge stored in the feedback capacitor Cfb2 during the period Coarse level-shifts the feedback voltage Vamp from the voltage Vc1 of the node n1 in a low voltage direction.

As a result, even when the input common-mode voltage during the Coarse period deviates from the predetermined voltage Vcm in a low voltage direction, the gain of the feedback amplifier 10 increases during the CV2 period by the action of the level-shift so that the input common-mode voltage can become equal to the predetermined voltage Vcm. Further, when the input common-mode voltage during the Coarse period is equal to the predetermined voltage Vcm, the feedback voltage Vamp also becomes equal to the predetermined voltage Vcm.

In the latter case, the voltage error caused by the finite nature of the gain does not occur. The sense amplifier 6 outputs voltages Vcm+(VrΔCs/Cf)+Voffset, Vcm−(VrΔCs/Cf)−Voffset containing a voltage depending on a change ΔCs in the sense capacitor Cs and an offset voltage error of the amplifiers 6 and 10. The CDS circuit can detect the physical quantity based on differences between output voltages Vout+, Vout− during the period CV2 and output voltages Vout+, Vout− held during the period CV1 without being affected by the offset voltages of the amplifiers 6 and 10.

When calculated with respect to the input terminal of the sense amplifier 6, a common-mode charge QCV2 during the period CV2 can be given by an equation (4).

$$QCV2 = Cfb1(Vcm - Vc1) + CsVcm \quad (4)$$

Since QCV1=QCV2 according to the law of conservation of charge, an equation (5) can be obtained.

$$Vc1 = Vreset + (2Cs/Cfb1)Vcm \quad (5)$$

The capacitance of the feedback capacitor Cfb2 can be relatively freely set and about twice Cfb1, for example. If the capacitance of the feedback capacitor Cfb2 is too small, a series capacitance of the feedback capacitors Cfb1 and Cfb2 becomes small, and accordingly the amplitude of the output of the feedback amplifier 10 becomes large. On the other hand, even if the capacitance of the feedback capacitor Cfb2 is too large, the series capacitance does not become too large, because the value of the series capacitance is mainly determined by Cfb1. Therefore, an effect on a reduction in the amplitude of the output of the feedback amplifier 10 is small.

As described above, according to the present embodiment, the detection circuit 1 controls the input common-mode voltage by the effect of the active common-mode feedback loop so that the input common-mode voltage can be equal to the predetermined voltage Vcm. Assuming that there is no common-mode feedback, the parasitic capacitance of the input terminal of the sense amplifier 6 has a temperature dependence and a voltage dependence even when the inverting side and the non-inverting side have the same characteristics (e.g., a capacitance, a temperature characteristic, a voltage characteristic). As a result, the amount by which the capacitive sensor 2 is driven varies so that sensitivity can vary. Further, if there is a parasitic capacitance mismatch between the inverting side and the non-inverting side, the amount by which the charge changes differs between the input terminals so that an offset can occur. If the temperature dependence or the voltage dependence of the parasitic capacitance differs between the inverting side and the non-inverting side, the mismatch amount varies depending on conditions, and therefore the offset can vary. The detection circuit 1 can reduce errors due to the parasitic capacitance by the effect of the common-mode feedback.

Since the preset voltage Vreset is applied during the period Reset so that the feedback capacitor Cfb1 can be precharged, the increase in the feedback voltage Vamp during the period Coarse is reduced accordingly. Thus, the capacitance of the feedback capacitor Cfb1 necessary to keep the input common-mode voltage at the predetermined voltage Vcm can be made small. When the capacitance becomes small, noise produced when the detection circuit 1 performs the C-V conversion is reduced so that the physical quantity can be accurately detected.

Further, as the preset voltage Vreset is set smaller, the capacitance of the sense capacitor Cs of the capacitive sensor 2 can be increased while maintaining the capacitance of the feedback capacitor Cf unchanged. Further, an applicable capacitance range as the feedback capacitor Cfb1 becomes wider by setting the preset voltage Vreset to a smaller value. Therefore, even when the capacitance of the sense capacitor Cs or the feedback capacitor Cfb1 varies, the above effect and advantage can be obtained. According to the present embodiment, since the preset voltage Vreser is set lower than the lower limit voltage Vmin outputtable by the feedback amplifier 10, the above effect becomes larger.

The common-mode voltage control circuit 7 stores charge in the feedback capacitor Cfb2 during the Coarse period and level-shifts the feedback voltage Vamp during the period CV2 by using the charge. Thus, even when the input common-mode voltage deviates from the predetermined voltage Vcm during the Coarse period, the input common-mode voltage can become equal to the predetermined voltage Vcm during the period CV2. Due to this effect, the capacitance of the feedback capacitor Cfb1 necessary to keep the input common-mode voltage at the predetermined voltage Vcm can be made smaller, so that the detection accuracy can be further improved.

Due to the above level-shift, the feedback voltage Vamp during the period CV2 becomes equal or close to the predetermined voltage Vcm. Thus, the feedback control is performed in a region where the gain of the feedback amplifier 10 is high so that the voltage error caused by the fact that the gain is finite can be reduced. Alternatively, the feedback amplifier 10 can have a lower gain. According to the present embodiment, the common-mode feedback loop is formed during the period Coarse. Therefore, even when the capacitance of the sense capacitor Cs or the feedback capacitor Cfb1 varies, these effects and advantages can be obtained.

It is preferable that the capacitance of the feedback capacitor Cfb1 be set so that the feedback voltage Vamp during the period Coarse can become a value close to the upper limit voltage Vmax outputtable by the feedback amplifier 10. A reason for this is as discussed below. When the feedback voltage Vamp during the period Coarse exceeds the upper limit voltage Vmax, the input common-mode voltage deviates from the predetermined voltage Vcm. On the other hand, as a margin with respect to the upper limit voltage Vmax is larger, the capacitance of the feedback capacitor Cfb1 necessary to control the input common-mode voltage equal to the predetermined voltage Vcm becomes larger.

The period CV1 is provided between the period Reset and the period Coarse, and the offset voltages of the amplifiers 6 and 10 are outputted to the CDS circuit. Thus, the physical quantity can be detected based on the difference in the output voltage between during the period CV1 and during the period CV2 without being affected by the offset voltages of the amplifiers 6 and 10. Further, since the detection circuit 1 has a fully differential structure, the detection circuit 1 has a great effect on suppression of common-mode noise, is capable of reducing errors such as charge injection and clock feedthrough, and is capable of increasing amplitude of an output signal.

Second Embodiment

Figure 1B:
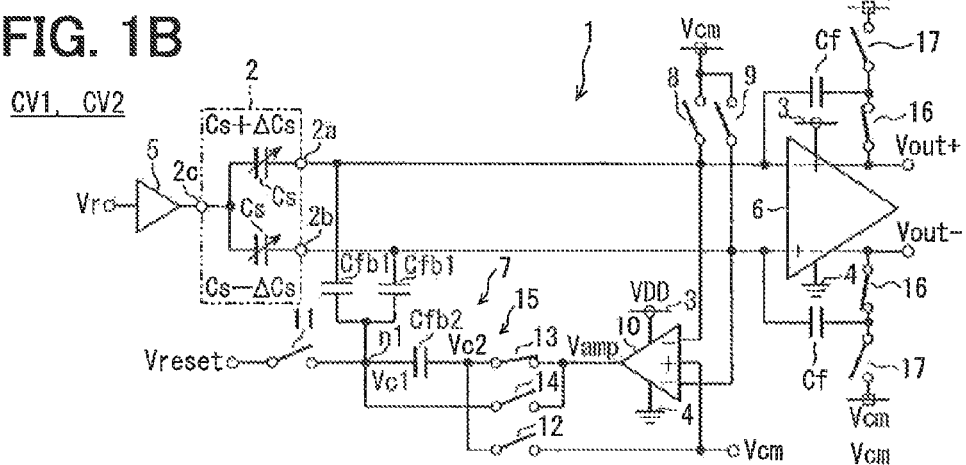
FIG. 1B is a diagram illustrating the detection circuit during a period CV1 and a period CV2 according to the first embodiment of the present disclosure.
Figure 1C:
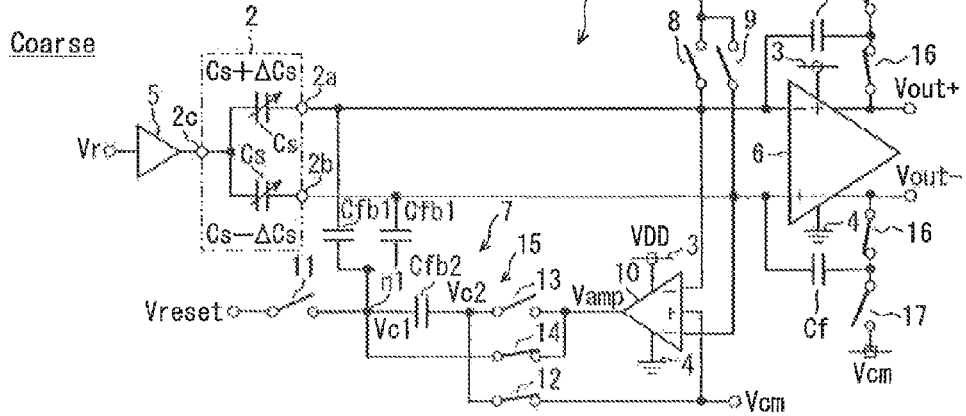
FIG. 1C is a diagram illustrating the detection circuit during a period Coarse according to the first embodiment of the present disclosure.
Figure 3A:
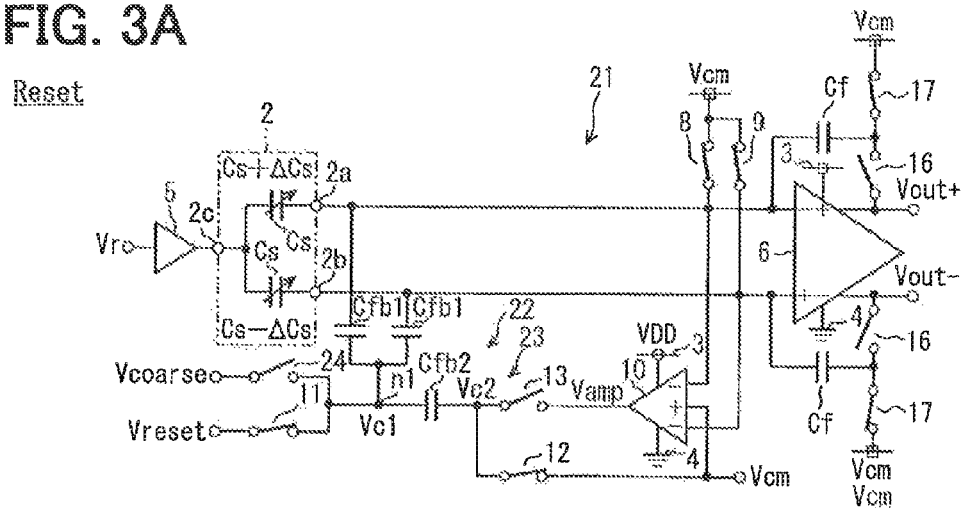
FIG. 3A is a diagram illustrating a detection circuit during a period Reset according to a second embodiment of the present disclosure.
Figure 3B:
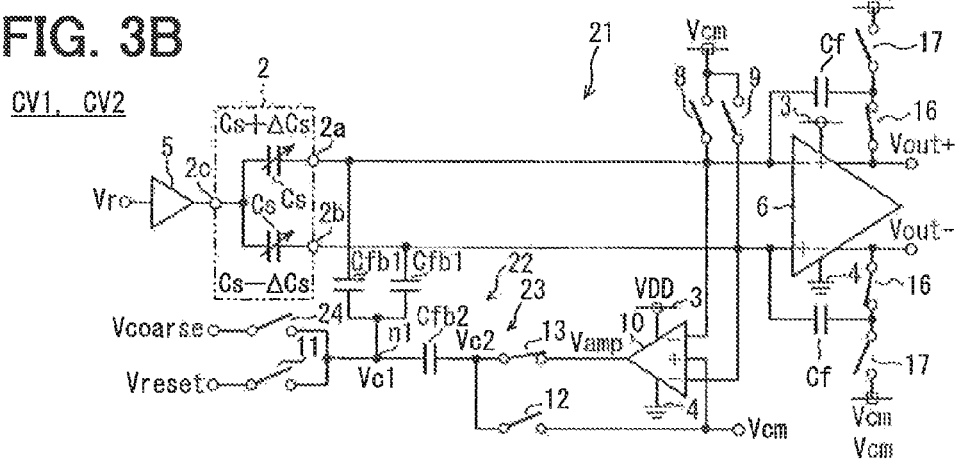
FIG. 3B is a diagram illustrating the detection circuit during a period CV1 and a period CV2 according to the second embodiment of the present disclosure.
Figure 3C:
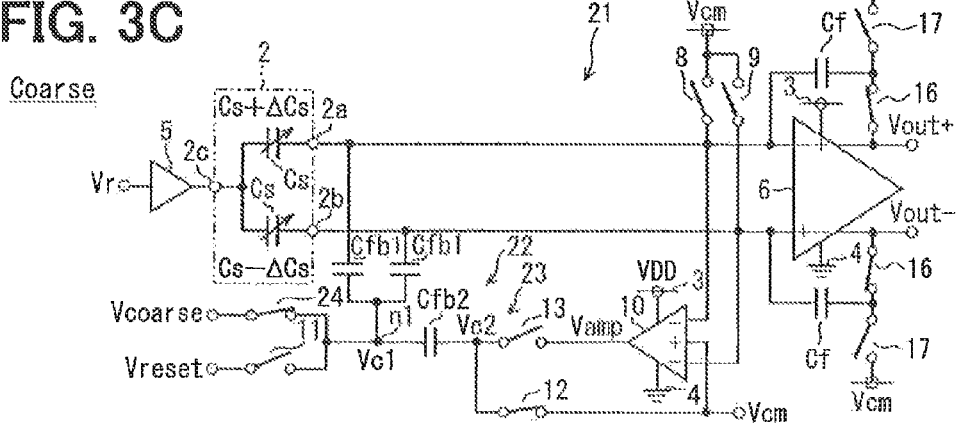
FIG. 3C is a diagram illustrating the detection circuit during a period Coarse according to the second embodiment of the present disclosure.

Next, a second embodiment is described below with reference to FIG. 3A, FIG. 3B, FIG. 3C, and FIG. 4. As shown in FIGS. 3A-C, a detection circuit 21 includes a common-mode voltage control circuit 22. The common-mode voltage control circuit 22 includes a voltage switch circuit 23. A difference of the voltage switch circuit 23 from the voltage switch circuit 15 shown in FIG. 1A, FIG. 1B, and FIG. 1C is that the switch 14 is replaced with a switch 24. The switch 24 is ON during the period Coarse.

The detection circuit 21 operates almost in the same manner as the detection circuit 1 shown in FIGS. 1A-C. However, the common-mode feedback loop is not formed during the period Coarse, and a second preset voltage Vcoarse is applied to the node n1 from an external power supply through the switch 24. The preset voltage Vcoarse (=Vc1) is set so that the input common-mode voltage can be equal to the predetermined voltage Vcm.

When calculated with respect to the input terminal of the sense amplifier 6, a common-mode charge Qcoarse during the period Coarse can be given by an equation (6).

$$Q\text{coarse}=C\!f\!b1(Vcm-Vc1)+CsVcm \qquad (6)$$

On the other hand, the common-mode charge QCV1 during the period CV1 can be given by the equation (1) as mentioned previously. Since QCV1=Qcoarse according to the law of conservation of charge, the preset voltage Vcoarse (=Vc1) becomes a voltage given by an equation (7).

$$Vc1=V\text{reset}+(2Cs/C\!f\!b1)Vcm \qquad (7)$$

According to the present embodiment, since the second preset voltage Vcoarse can be set greater than the upper limit voltage Vmax of the feedback amplifier 10, the level-shift amount of the feedback capacitor Cfb2 during the period CV2 can increased. Accordingly, since the capacitance of the feedback capacitor Cfb1 can be made smaller, the noise produced by the C-V conversion is reduced so that the physical quantity can be accurately detected. Further, since the feedback amplifier Vamp is not used during the period Coarse, the feedback amplifier 10 can have a narrow voltage output range. In addition, the same effect and advantage as the first embodiment can be obtained.

Third Embodiment

Figure 5A:
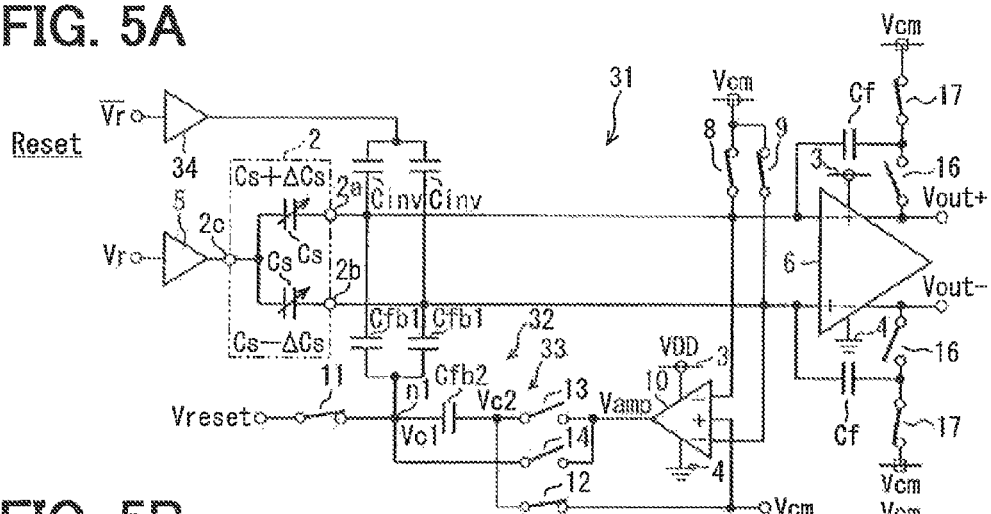
FIG. 5A is a diagram illustrating a detection circuit during a period Reset according to a third embodiment of the present disclosure.
Figure 5B:
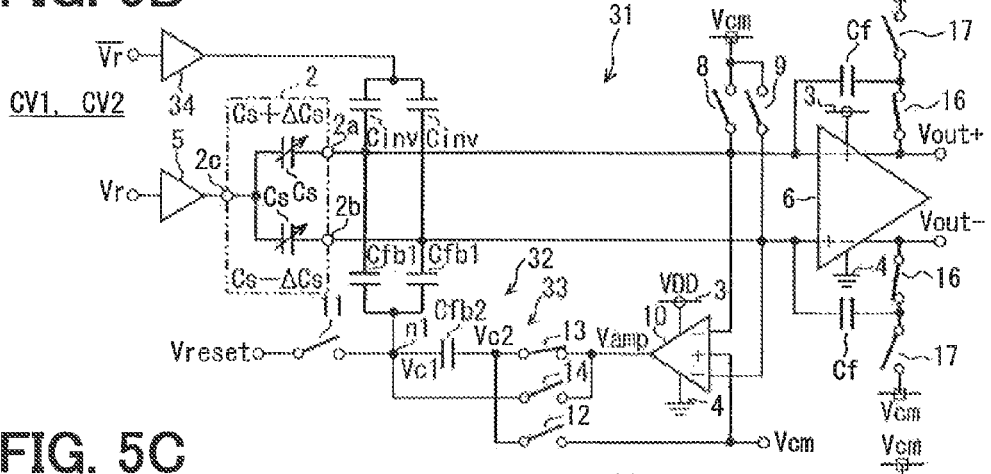
FIG. 5B is a diagram illustrating the detection circuit during a period CV1 and a period CV2 according to the third embodiment of the present disclosure.
Figure 5C:
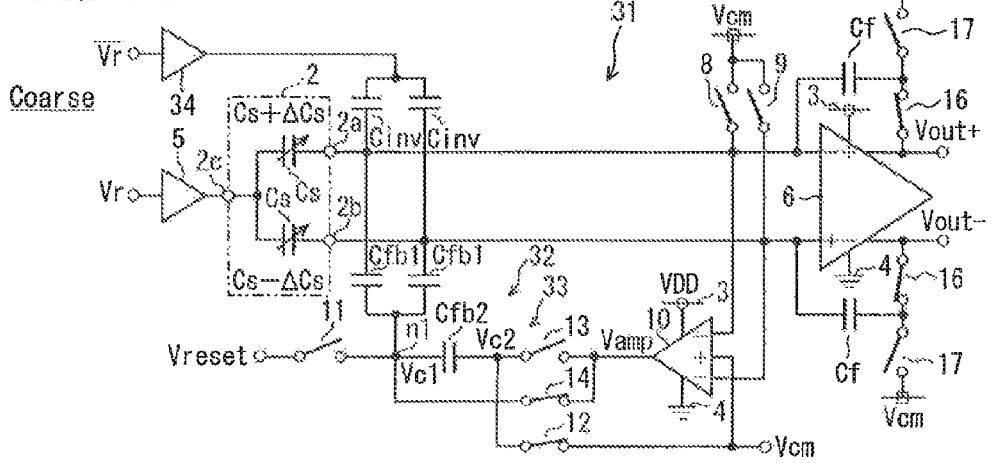
FIG. 5C is a diagram illustrating the detection circuit during a period Coarse according to the third embodiment of the present disclosure.

Next, a third embodiment is described below with reference to FIG. 5A, FIG. 5B, FIG. 5C, and FIG. 6. As shown in FIGS. 5A-C, a detection circuit 31 includes a common-mode voltage control circuit 32. The common-mode voltage control circuit 32 includes a feedback amplifier 10, a pair of first feedback capacitors Cfb1, a second feedback capacitor Cfb2, a pair of compensation capacitors Cinv, a voltage switch circuit 33 constructed with switches 11-14, and an inversion drive signal generation circuit 34.

One ends of the compensation capacitors Cinv are respectively connected to the detection terminals 2a and 2b. The other ends of the compensation capacitors Cinv are connected to an output terminal of the inversion drive signal generation circuit 34. Capacitances of the compensation capacitors Cinv are set equal to the capacitances of the sense capacitors Cs. The inversion drive signal generation circuit 34 outputs an inversion drive signal /Vr (/ represents a bar) varying between the second level (0V) and the first level (2Vcm) in such a manner that the inversion drive signal /Vr has an opposite phase to the drive signal Vr. The voltage switch circuit 33 has the same connection condition as the voltage switch circuit 15, but differs in that the first preset voltage Vreset is equal to the predetermined voltage Vcm.

Figure 6:
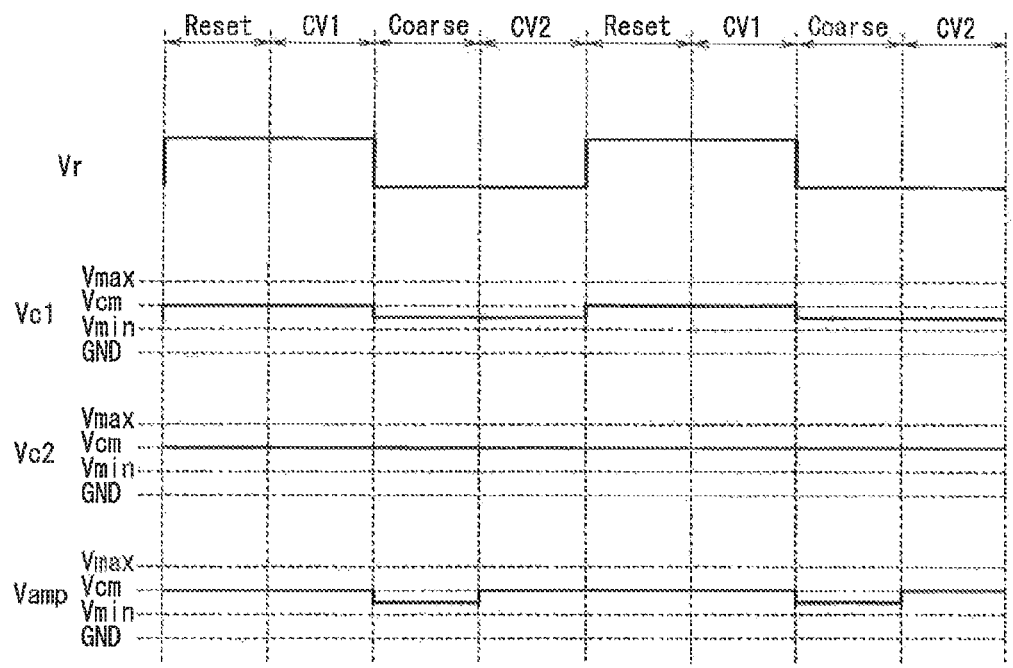
FIG. 6 is a waveform diagram illustrating control of an input common-mode voltage according to the third embodiment of the present disclosure.

Next, an effect according to the present embodiment is described. An explanation for the same effect as the first embodiment is omitted. As shown in FIG. 6, the common-mode voltage control circuit 32 repeats (a) the period Reset, (b) the period CV1, (c) the period Coarse, and (b) the period CV2 in turn. As long as the capacitances of the sense capacitors Cs are equal to the capacitances of the compensation capacitors Cinv, the input common-mode voltage is kept equal to the predetermined voltage Vcm by driving the compensation capacitors Cinv with the inversion drive signal /Vr. However, in practice, a common-mode feedback loop is necessary, because a difference in capacitance between the sense capacitor Cs and the compensation capacitor Cinv occurs due to, for example, manufacturing variation, aging degradation, and temperature drift.

During the period Reset, charge is stored in the compensation capacitors Cinv to counter the inversion of the level of the drive signal Vr. According to the present embodiment, since Vreset=Vcm, no charge is stored in the feedback capacitors Cfb1 and Cfb2.

When the drive signal Vr decreases from 2Vcm to 0 during the Coarse after the period CV1, the inversion drive signal /Vr increases from 0V to 2Vcm so that an effect to maintain the input common voltage can be generated. Further, a common-mode feedback loop is formed through the feedback capacitors Cfb1 so that the input common-mode voltage can become equal to the predetermined voltage Vcm. At this time, the feedback voltage Vamp remains unchanged at the predetermined voltage Vcm (Cinv=Cs), increases (Cinv<Cs), or decreases (Cinv>Cs). FIG. 6 shows a case where Cinv>Cs. In any of the above cases, the feedback voltage Vamp becomes equal to the predetermined voltage Vcm during the period CV2.

According to the present embodiment, the input common-mode voltage is compensated mainly by the effect of the inversion drive signal generation circuit 34 and the compensation capacitors Cinv, and the common-mode feedback assists this compensation action. As a result, the input common-mode voltage and the feedback voltage Vamp can be controlled to the predetermined voltage Vcm. Thus, the same effect and advantage as the first embodiment can be obtained. Although the capacitances of the sense capacitors Cs can be different from the capacitances of the compensation capacitors Cinv, it is preferable that Cinv=Cs to reduce the total capacitance of the compensation capacitors Cinv and the feedback capacitors Cfb1.

Fourth Embodiment

Next, a fourth embodiment is described below with reference to FIG. 7A, FIG. 7B, FIG. 7C, FIG. 7D, and FIG. 8. As shown in FIGS. 7A-D, a detection circuit 41 includes a common-mode voltage control circuit 42. The common-mode voltage control circuit 42 includes a feedback amplifier 10, a pair of first feedback capacitors Cfb1, a second feedback capacitor Cfb2, a pair of third feedback capacitors Cfb3, a voltage switch circuit 43 constructed with switches 11-14, 44, and 45.

One ends of the third feedback capacitors Cfb3 are respectively connected to the detection terminals 2a and 2b. The other ends of the third feedback capacitors Cfb3 are connected together. The other ends of the third feedback capacitors Cfb3 are connected to the power supply line 4 through the switch 44 and also connected to the node n1 through the switch 45. The switches 11-14 operate in the same manner as described in the first embodiment. The switch 44 is ON during the period Reset and the period CV1. The switch 45 is ON during the period Coarse and the period CV2.

Figure 8:
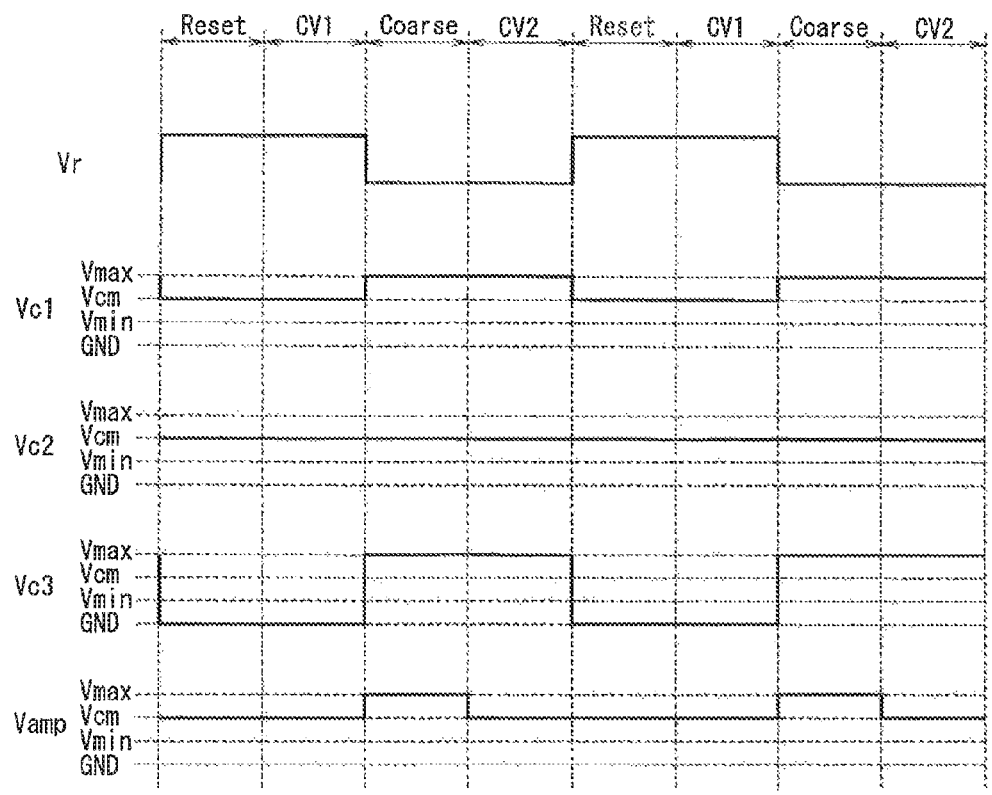
FIG. 8 is a waveform diagram illustrating control of an input common-mode voltage according to the fourth embodiment of the present disclosure.

Next, an effect according to the present embodiment is described. An explanation for the same effect as the first embodiment is omitted. As shown in FIG. 8, the common-mode voltage control circuit 42 repeats (a) the period Reset, (b) the period CV1, (c) the period Coarse, and (d) the period CV2 in turn.

During the period Reset, the switch 44 is ON, and the switch 45 is OFF, so that a second preset voltage is applied to the other ends of the feedback capacitors Cfb3. The second preset voltage is a voltage existing in a voltage direction in which the second level (0V) exists relative to the first level (2Vcm) with respect to the predetermined voltage Vcm, i.e., is a voltage (0V) of the power supply line 4 (ground line) existing in a low voltage direction with respect to the predetermined voltage Vcm. Thus, charge is stored in the feedback capacitors Cfb3 to counter the inversion of the level of the drive signal Vr. In this case, the switch 11 is turned ON so that the first preset voltage can be applied to the other ends of the feedback capacitors Cfb1. However, since the first preset voltage is equal to the predetermined voltage Vcm according to the present embodiment, no charge is stored in the feedback capacitors Cfb1.

During the period CV1, a common feedback loop is formed through the feedback capacitors Cfb2 and Cfb1. The charge remains stored in the feedback capacitors Cfb3. When calculated with respect to the input terminal of the sense amplifier 6, a common-mode charge QCV1 can be given by an equation (8).

$$QCV1 = Cfb3 Vcm - Cs Vcm \qquad (8)$$

During the period Coarse and the period CV2, the switch 44 is OFF, and the switch 45 is ON. Therefore, the feedback capacitors Cfb1 and Cfb3 are connected in parallel between the node n1 and the detection terminals 2a and 2b. When calculated with respect to the input terminal of the sense amplifier 6, a common-mode charge Qcoarse can be given by an equation (9).

$$Q\text{coarse}=(Cfb1+Cfb3)(Vcm-Vc1)+CsVcm \quad (9)$$

Since QCV1=Qcoarse according to the law of conservation of charge, an equation (10) can be obtained.

$$Vc1=((Cfb1+2Cs)/(Cfb1+Cfb3))Vcm \quad (10)$$

During the period Coarse and the period CV2, a common-mode feedback loop is formed through the feedback capacitors Cfb1 and Cfb3 connected in parallel. Thus, the input common-mode voltage and the feedback voltage Vamp become equal to the predetermined voltage Vcm by the same action as the first embodiment.

According to the present embodiment, since the feedback capacitors Cfb3 are precharged during the period Reset, the increase in the feedback voltage Vamp during the period Coarse is reduced by the charge. Thus, the total capacitance of the feedback capacitors Cfb1 and Cfb3 necessary to keep the input common-mode voltage at the predetermined voltage Vcm can be made small, so that the physical quantity can be accurately detected. The equation (10) indicates that when the total capacitance of the feedback capacitors Cfb1 and Cfb3 is maintained unchanged, the increase in the feedback voltage Vamp during the period Coarse can be effectively reduced by increasing the ratio of the capacitance of the feedback capacitors Cfb3.

Further, since the first and second preset voltages used in the present embodiment are only the predetermined voltage Vcm and 0V, a power supply structure can be simplified compared to the other embodiments. Further, the same effect and advantage as the first embodiment can be obtained.

(Modifications)

While the present disclosure has been described with reference to embodiments thereof, it is to be understood that the disclosure is not limited to the embodiments. The present disclosure is intended to cover various modifications and equivalent arrangements within the spirit and scope of the present disclosure.

In the first and second embodiments, the preset voltage Vreset can be set equal to the predetermined voltage Vcm. Even in this case, since the level-shift effect can be obtained during transition from the period Coarse to the period CV2, the capacitance of the feedback capacitors Cfb1 can be made small.

In the second embodiment, the preset voltage Vcoarse can be set so that the input common-mode voltage during the period Coarse can be almost equal to the predetermined voltage Vcm. Such a preset voltage Vcoarse is a voltage for causing the input common-mode voltage to be equal to the predetermined voltage Vcm after a transition to the period CV2. Further, the preset voltage Vreset can be a voltage between the voltage of the power supply line 4 and the lower limit voltage Vmin outputtable by the feedback amplifier 10.

In the fourth embodiment, the first preset voltage can be different from the predetermined voltage Vcm. Further, the second preset voltage is not limited to 0V as long as the second preset voltage is a voltage existing in a low voltage direction with respect to the predetermined voltage Vcm.

The CDS circuit is not always necessary in each embodiment. If the CDS circuit is not used, the period CV1 is unnecessary. A means for compensating the offset is not limited to the CDS circuit connected to the latter part. Other means, such as offset canceling function added to the sense amplifier 6, can be used. Even when other means are used, it is preferable that the CDS circuit be used in combination.

The same effect can be obtained in each embodiment, even when the first level of the drive signal Vr is 0V, and the second level of the drive signal Vr is 2Vcm. In this case, a voltage direction in which the second level exists relative to the first level with respect to the predetermined voltage means a high voltage direction with respect to the predetermined voltage Vcm. Further, the first level and the second level are not limited to 2Vcm and 0V and can be modified as appropriate to obtain desired detection sensitivity.

What is claimed is:

1. A detection circuit for a capacitive sensor including a pair of sense capacitors with capacitances having a difference responsive to a physical quantity, first ends of the sense capacitors being connected together to provide a common terminal, second ends of the sense capacitors being configured to provide separate detection terminals, the detection circuit comprising:
   a drive signal generation circuit capable of generating and applying a drive signal to the common terminal, the drive signal varying between a first level and a second level;
   a fully differential sense amplifier having inverting and non-inverting input terminals respectively connected to the detection terminals, the sense amplifier being capable of outputting a differential voltage according to the difference between the capacitances of the sense capacitors; and
   a common-mode voltage control circuit capable of controlling an input common-mode voltage of the sense amplifier to a predetermined voltage, wherein
   the common-mode voltage control circuit includes a feedback amplifier, a pair of first feedback capacitors, a second feedback capacitor, and a voltage switch circuit,
   the feedback amplifier outputs a feedback voltage according to a difference between the input common-mode voltage and the predetermined voltage,
   the first feedback capacitors have first ends respectively connected to the detection terminals and have second ends connected together,
   the second feedback capacitor has a first end connected to the second ends of the first feedback capacitors,
   the voltage switch circuit applies the predetermined voltage or a first preset voltage to the second ends of the first feedback capacitors to charge the first feedback capacitors during the first level of the drive signal,
   the first preset voltage has a voltage value existing in a voltage direction in which the second level exists relative to the first level with respect to the predetermined voltage,
   the voltage switch circuit applies a second preset voltage to the second ends of the first feedback capacitors and applies the predetermined voltage to a second end of the second feedback capacitor to charge the second feedback capacitor during the second level of the drive signal, and then applies the feedback voltage to the second end of the second feedback capacitor instead of the application of the second preset voltage and the predetermined voltage, and
   the second preset voltage has a voltage value existing in a voltage direction in which the first level exists relative to the second level with respect to the predetermined voltage.

2. The detection circuit according to claim 1, wherein
the first preset voltage is between a voltage of a power supply line on a voltage side where the second level exists relative to the first level and a limit voltage outputtable by the feedback amplifier in a voltage direction in which the second level exists relative to the first level.

3. The detection circuit according to claim 1, wherein
the voltage switch circuit applies the first preset voltage to the second ends of the first feedback capacitors and applies the predetermined voltage to the second end of the second feedback capacitor to charge the second feedback capacitor during the first level of the drive signal, and then applies the feedback voltage to the second end of the second feedback capacitor instead of the application of the first preset voltage and the predetermined voltage.

4. The detection circuit according to claim 1, wherein
the second preset voltage is set so that the input common-mode voltage of the sense amplifier becomes almost equal to the predetermined voltage during the second level of the drive signal under a condition that the second preset voltage is being applied to the second ends of the first feedback capacitors.

5. The detection circuit according to claim 4, wherein
the voltage switch circuit applies the feedback voltage as the second preset voltage to the second ends of the first feedback capacitors during the second level of the drive signal.

6. The detection circuit according to claim 5, wherein
the second preset voltage is a value close to a limit voltage outputtable by the feedback amplifier in a voltage direction in which the first level exists relative to the second level.

7. A detection circuit for a capacitive sensor including a pair of sense capacitors with capacitances having a difference responsive to a physical quantity, first ends of the sense capacitors being connected together to provide a common terminal, second ends of the sense capacitors being configured to provide separate detection terminals, the detection circuit comprising:
a drive signal generation circuit capable of generating and applying a drive signal to the common terminal, the drive signal varying between a first level and a second level;
a fully differential sense amplifier having inverting and non-inverting input terminals respectively connected to the detection terminals, the sense amplifier being capable of outputting a differential voltage according to the difference between the capacitances of the sense capacitors; and
a common-mode voltage control circuit capable of controlling an input common-mode voltage of the sense amplifier to a predetermined voltage, wherein
the common-mode voltage control circuit includes a pair of compensation capacitors, an inversion drive signal generation circuit, a feedback amplifier, a pair of first feedback capacitors, a second feedback capacitor, and a voltage switch circuit,
the compensation capacitors have first ends respectively connected to the detection terminals and have second ends connected together,
the inversion drive signal generation circuit generates and applies an inversion drive signal to the second ends of the compensation capacitors, the inversion drive signal varying between the second level and the first level in such a manner that the inversion drive signal has an opposite phase to the drive signal,
the feedback amplifier outputs a feedback voltage according to a difference between the input common-mode voltage and the predetermined voltage,
the first feedback capacitors have first ends respectively connected to the detection terminals and have second ends connected together,
the second feedback capacitor has a first end connected to the second ends of the first feedback capacitors,
the voltage switch circuit applies a first preset voltage with a certain voltage value to the second ends of the first feedback capacitors to charge the first feedback capacitors during the first level of the drive signal, and
the voltage switch circuit applies the feedback voltage to the second ends of the first feedback capacitors and applies the predetermined voltage to a second end of the second feedback capacitor to charge the second feedback capacitor during the second level of the drive signal, and then applies the feedback voltage to the second end of the second feedback capacitor instead of the application of the feedback voltage and the predetermined voltage.

8. The detection circuit according to claim 7, wherein
the voltage switch circuit applies the first preset voltage to the second ends of the first feedback capacitors and applies the predetermined voltage to the second end of the second feedback capacitor to charge the second feedback capacitor during the first level of the drive signal, and then applies the feedback voltage to the second end of the second feedback capacitor instead of the application of the first preset voltage and the predetermined voltage.

9. The detection circuit according to claim 7, wherein
a capacitance of the compensation capacitors is almost equal to a capacitance of the sense capacitors, and
the first preset voltage is equal to the predetermined voltage.

10. A detection circuit for a capacitive sensor including a pair of sense capacitors with capacitances having a difference responsive to a physical quantity, first ends of the sense capacitors being connected together to provide a common terminal, second ends of the sense capacitors being configured to provide separate detection terminals, the detection circuit comprising:
a drive signal generation circuit capable of generating and applying a drive signal to the common terminal, the drive signal varying between a first level and a second level;
a fully differential sense amplifier having inverting and non-inverting input terminals respectively connected to the detection terminals, the sense amplifier being capable of outputting a differential voltage according to the difference between the capacitances of the sense capacitors; and
a common-mode voltage control circuit capable of controlling an input common-mode voltage of the sense amplifier to a predetermined voltage, wherein
the common-mode voltage control circuit includes a feedback amplifier, a pair of first feedback capacitors, a second feedback capacitor, a pair of third feedback capacitors, and a voltage switch circuit,
the feedback amplifier outputs a feedback voltage according to a difference between the input common-mode voltage and the predetermined voltage,
the first feedback capacitors have first ends respectively connected to the detection terminals and have second ends connected together, the second feedback capacitor has a first end connected to the second ends of the first feedback capacitors, the third feedback capacitors have first ends respectively connected to the detection terminals and have second ends connected together, the voltage switch circuit applies a first preset voltage with a certain voltage value to the second ends of the first feedback capacitors to charge the first feedback capacitors and applies a second preset voltage to the second ends of the third feedback capacitors to charge the third feedback capacitors during the first level of the drive signal, the second preset voltage has a voltage value existing in a voltage direction in which the second level exists relative to the first level with respect to the predetermined voltage, and the voltage switch circuit applies the feedback voltage to the second ends of the first feedback capacitors and the second ends of the third feedback capacitors and applies the predetermined voltage to a second end of the second feedback capacitor to charge the second feedback capacitor during the second level of the drive signal, and then applies the feedback voltage to the second end of the second feedback capacitor instead of the application of the feedback voltage and the predetermined voltage.

11. The detection circuit according to claim 10, wherein
the voltage switch circuit applies the predetermined voltage to the second end of the second feedback capacitor to charge the second feedback capacitor during the first level of the drive signal while charging the first feedback capacitors and the third feedback capacitors, and then applies the feedback voltage to the second end of the second feedback capacitor instead of the application of the first preset voltage and the predetermined voltage.

12. The detection circuit according to claim 10, wherein
the first preset voltage is equal to the predetermined voltage, and
the second preset voltage is equal to a voltage of a power supply line on a voltage side where the second level exists relative to the first level.

* * * * *